United States Patent [19]

Czichy

[11] Patent Number: 4,477,312
[45] Date of Patent: Oct. 16, 1984

[54] COMPOSITE FOIL FROM WHICH LAYER AREAS HAVING METALLIC LUSTER ARE TRANSFERRED ONTO A BASE

[75] Inventor: Eleonore Czichy, Augsburg, Fed. Rep. of Germany

[73] Assignee: Interletter AG

[21] Appl. No.: 498,668

[22] Filed: May 31, 1983

Related U.S. Application Data

[63] Continuation of Ser. No. 281,287, Jul. 7, 1981, abandoned.

[30] Foreign Application Priority Data

Jul. 10, 1980 [DE] Fed. Rep. of Germany ....... 3026236

[51] Int. Cl.$^3$ .......................... B41M 3/14; B44C 1/22
[52] U.S. Cl. .................... 156/656; 156/634; 156/659.1; 156/233; 156/234; 156/240; 156/249; 156/277; 427/146; 427/264; 427/270; 427/271; 428/200; 428/202; 428/209; 428/913; 428/914
[58] Field of Search ................ 156/654–656, 156/234, 241, 277, 659.1, 629–634, 664–666, 668, 233, 235, 238, 240, 249, 305; 427/146–148, 259, 264, 270–272, 282, 294, 404, 419.1; 428/200–202, 209, 913, 914, 208; 430/5, 11, 14, 15, 18

[56] References Cited

U.S. PATENT DOCUMENTS

| | | | |
|---|---|---|---|
| 1,888,154 | 11/1932 | Allen et al. | 427/148 |
| 3,089,800 | 5/1963 | Colfer et al. | 428/40 |
| 3,358,337 | 12/1967 | Schuchardt | 24/27 |
| 3,463,651 | 8/1969 | Warsager | 428/138 |
| 3,961,121 | 6/1976 | Warsager | 428/200 |
| 4,012,552 | 3/1977 | Watts | 428/914 |
| 4,242,378 | 12/1980 | Arai | 427/271 |
| 4,313,994 | 2/1982 | Kingston | 428/200 |

Primary Examiner—Bruce H. Hess
Attorney, Agent, or Firm—Toren, McGeady and Stanger

[57] ABSTRACT

A method for producing a composite foil which has metallic lustrous layer areas with an image structure for transferring onto a base, comprising
(a) applying at least one continuous lacquer layer on a carrier layer;
(b) applying a continuous metal layer onto at least one lacquer layer;
(c) applying a solvent resistant layer onto the metal layer, said solvent resistant layer being divided into areas which have the shape of the image structure, leaving areas of the continuous metal layer and the at least one continuous lacquer layer thereunder uncovered by the solvent resistant layer;
(d) removing said uncovered areas of the continuous metal layer and the at least one continuous lacquer layer thereunder by treatment with a solvent therefor; and
(e) applying a continuous adhesive layer onto the image structure carrying side of the treated composite foil from step (d), which adhesive layer fills said removed areas between the image structure and covers said areas and said image structure.

This process is advantageous since it does not require embossing to obtain a desired image.

7 Claims, 2 Drawing Figures

COMPOSITE FOIL FROM WHICH LAYER AREAS HAVING METALLIC LUSTER ARE TRANSFERRED ONTO A BASE

This is a continuation of application Ser. No. 281,287, filed July 7, 1981, now abandoned.

BACKGROUND OF THE INVENTION

1. Field of the Invention

The invention relates to a composite foil from which metallically lustrous layer areas which have an image structure are to be transferred onto a base. The composite foil has a carrier layer, with a lacquer layer on the carrier layer, with a metal layer on the lacquer layer and with an adhesive layer on the metal layer.

2. Description of the Prior Art

In a known composite foil of this type, the lacquer layer and the metal layer are continuous. By means of a heated die which has the image structure and is pressed on the carrier layer, the lacquer can be removed in part from the carrier layer, at the same areas the adhesive is activated and thus the metal layer is in these areas transferred to a base. Since for each image structure a separate die is required which—because it is heated to a relatively high temperature—must consist of metal, this technique is only economical for large requirements.

SUMMARY OF THE INVENTION

It is the task of the invention to specify a composite foil of the type described above which can also be used economically for small requirements.

The composite foil is characterized for the solution of this task in that the lacquer layer and the metal layer are divided into areas which have the shape of the image structure, and that the carrier layer can be removed from the lacquer layer and the adhesive which is located between the two areas by pulling off the carrier layer at room temperature.

When using this composite foil, the adhesive layer is merely pressed on the base, perhaps with a creaser, and then the carrier layer is pulled off. The composite foil carries the image structure. This image structure however can be produced in a very simple manner. A preferred method is characterized in that a continuous lacquer layer is applied on the carrier layer, followed by an optional continuous tinted layer, then a metal layer, and then a solvent-resistant layer which is divided into areas that have the shape of the image structure. Then the metal of the metal layer, and, if applicable, the material of the tinted layer, and the lacquer of the lacquer layer between the areas are removed by means of at least one solvent and the adhesive layer is applied.

Advantageous embodiments of the invention are described in the sub-claims 2 to 10 and 12 to 14.

The invention is explained below with the aid of an exemplified embodiment, referring to the enclosed drawing:

DESCRIPTION OF THE PREFERRED EMBODIMENT

Figure 1:
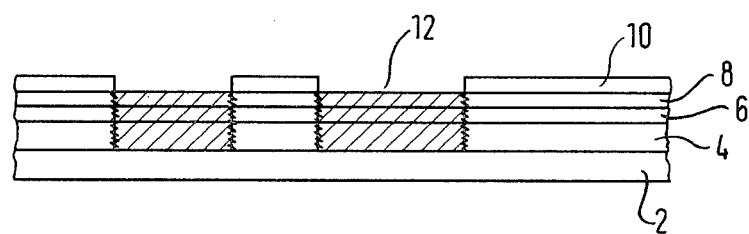
FIG. 1 shows a composite foil in cross section in the first phases of its production.
Figure 2:
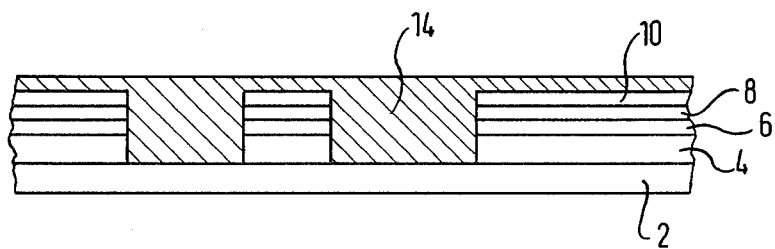
FIG. 2 shows the completed composite foil in cross section.

On a polyester foil 2 first a continuous layer 4 of lacquer is applied from which the foil 2 is to be pulled off in the cold state. When using a foil 2 of polyethylene a vinyl lacquer has proven to be advantageous which was dissolved in a mixture of acetone and butanol 2. Onto the layer 4 a continuous layer 6 was applied which is transparent as is the layer 4 but tinted. This layer 6 may be a pigmented lacquer based on vinyl chloride/vinyl acetate. If no tinting is desired, the layer 6 may be omitted. The layer 6 may also be omitted when the layer 4 is tinted. Onto the continuous layer 6 a continuous metal layer 8, perhaps of aluminum, was applied, e.g. by steaming the layer on. Such a metal layer may also be provided with tinting additives.

An image structure 10 was applied onto the continuous layer 8 by means of printing ink or by a means of a light-hardened emulsion. The image structure 10 thus left the areas 12 blank. The aluminum layer could be removed in these areas 12 by means of a suitable solvent, e.g. soda lye. A 5% vinegar essence may be used to stop the removal process and to neutralize the soda lye. Subsequently the layer areas 6 and 4 can be removed with suitable solvents. Once this has been accomplished, the image structure is coated with a contact adhesive 14. (In the figures of course the thickness ratios are not shown in correct scale, but are shown in such a way that the structure of the layers becomes clear.)

I claim:

1. A method for the production of a composite foil from which metallically lustrous layer areas having an image structure are to be transferred onto a base, and having a carrier layer, a lacquer layer on the carrier layer, a metal layer on the lacquer layer and an adhesive layer on the metal layer which comprises
   (a) applying at least one continuous lacquer layer on the carrier layer;
   (b) applying a continuous metal layer onto the at least one lacquer layer;
   (c) applying a solvent resistant layer onto the metal layer, said solvent resistant layer being divided into areas which have the shape of the image structure, leaving areas of the continuous metal layer and the at least one continuous lacquer layer thereunder uncovered by the solvent resistant layer;
   (d) removing said uncovered areas of the continuous metal layer and the at least one continuous lacquer layer thereunder by treatment with a solvent therefor; and
   (e) applying a continuous adhesive layer onto the image structure carrying side of the treated composite foil from step (d), which adhesive layer fills said removed areas between the image structure and covers said areas and said image structure.

2. The method of claim 1 wherein the lacquer layer is tinted.

3. The method of claim 1 wherein the lacquer layer is untinted and a second continuous tinted lacquer layer is applied onto the lacquer layer.

4. The method of claim 1 wherein the solvent resistant layer is formed from a photographic emulsion which had been exposed to light or of a printing ink which is based on polyamide.

5. The method of claim 1 wherein after step (c) and prior to step (d), a powder is applied to the surface of the solvent resistant layer and exposed metal layer.

6. The method of claim 5 wherein the powder is talcum.

7. The method of claim 1 wherein said metal layer is aluminum and said solvent for its uncovered areas is soda lye.

* * * * *